United States Patent
Sauciuc

(10) Patent No.: US 7,786,654 B2
(45) Date of Patent: Aug. 31, 2010

(54) COMPACT RAKE PIEZOELECTRIC ASSEMBLY AND METHOD OF MANUFACTURING SAME

(75) Inventor: Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 12/047,432

(22) Filed: Mar. 13, 2008

(65) Prior Publication Data

US 2009/0230819 A1 Sep. 17, 2009

(51) Int. Cl.
*H01L 41/04* (2006.01)
(52) U.S. Cl. .................. 310/328; 310/331
(58) Field of Classification Search ........... 310/328, 310/330–332, 341
See application file for complete search history.

(56) References Cited

U.S. PATENT DOCUMENTS

| | | | |
|---|---|---|---|
| 2004/0190305 A1* | 9/2004 | Arik et al. | 362/555 |
| 2006/0138905 A1 | 6/2006 | Gonzales et al. | |
| 2007/0001550 A1 | 1/2007 | Palanduz et al. | |
| 2007/0037506 A1 | 2/2007 | Lee et al. | |

OTHER PUBLICATIONS

Lee, Seri, et al., "Cooling Device, System Containing Same, and Cooling Method" filed Mar. 6, 2007 assigned U.S. Appl. No. 11/714,333.

Ioan Sauciuc, et al. "Future CPU Cooling Building Blocks—Performance and Challenges", Intel Assembly & Test Technology Journal, IATTJ, vol. 9, 2006 12 pgs.

Ioan Sauciuc, "Piezo Actuators for Electronics Cooling", Electronics Cooling, vol. 13, No. 1, Feb. 2007, pp. 12-17.

Leija, Javier, et al., "Heatsink, Method of Manufacturing Same, and Microelectronic Package Containing Same" Filed Jun. 30, 2007 assigned U.S. Appl. No. 11/772,144.

Erturk, Hakan, et al., "Piezoelectric Fan, Method of Cooling a Microelectronic Device Using Same, and System Containing Same" Filed Jul. 26, 2007 assigned U.S. Appl. No. 11/828,759.

Cho, J.H., et al. "Efficiency of energy comerision by piezoelectrics", Applied Physics Letters, 89, 104107, 2006, 3 pgs.

Chrysler, Gregory, et al., "Piezoelectric Fan, Cooling Device Containing Same, and Method of Cooling a Microelectronic Device Using Same", Filed Sep. 27, 2007 assigned U.S. Appl. No. 11/862,194.

* cited by examiner

*Primary Examiner*—Walter Benson
*Assistant Examiner*—Derek J Rosenau
(74) *Attorney, Agent, or Firm*—Kenneth A. Nelson

(57) ABSTRACT

A compact rake piezoelectric assembly comprises a body (110), a plurality of blades (120) extending away from the body, and a piezoelectric patch (130) attached to the body. The piezoelectric patch has a fixed portion (138) and a free portion (139), with the fixed portion being constrained to be in physical contact with the body.

12 Claims, 3 Drawing Sheets

COMPACT RAKE PIEZOELECTRIC ASSEMBLY AND METHOD OF MANUFACTURING SAME

FIELD OF THE INVENTION

The disclosed embodiments of the invention relate generally to cooling mechanisms for microelectronic devices, and relate more particularly to piezoelectric cooling assemblies.

BACKGROUND OF THE INVENTION

Microelectronic devices generate heat during their operation that must be safely dissipated in order to prevent premature failure and in order to improve reliability and performance. One method of dissipating heat is to cause air to flow across regions of elevated temperature. This airflow carries heated air away from high temperature regions, placing it at cooler regions where its effects will not be problematic, and draws cooler air into the high temperature regions to take the place of the heated air that is removed. In some cases such airflow is generated by a piezoelectric fan, in which an externally-applied voltage causes the shape of a piezoelectric material to change slightly, thus causing a blade attached to the piezoelectric material to oscillate and produce airflow.

BRIEF DESCRIPTION OF THE DRAWINGS

The disclosed embodiments will be better understood from a reading of the following detailed description, taken in conjunction with the accompanying figures in the drawings in which.

Figure 1:
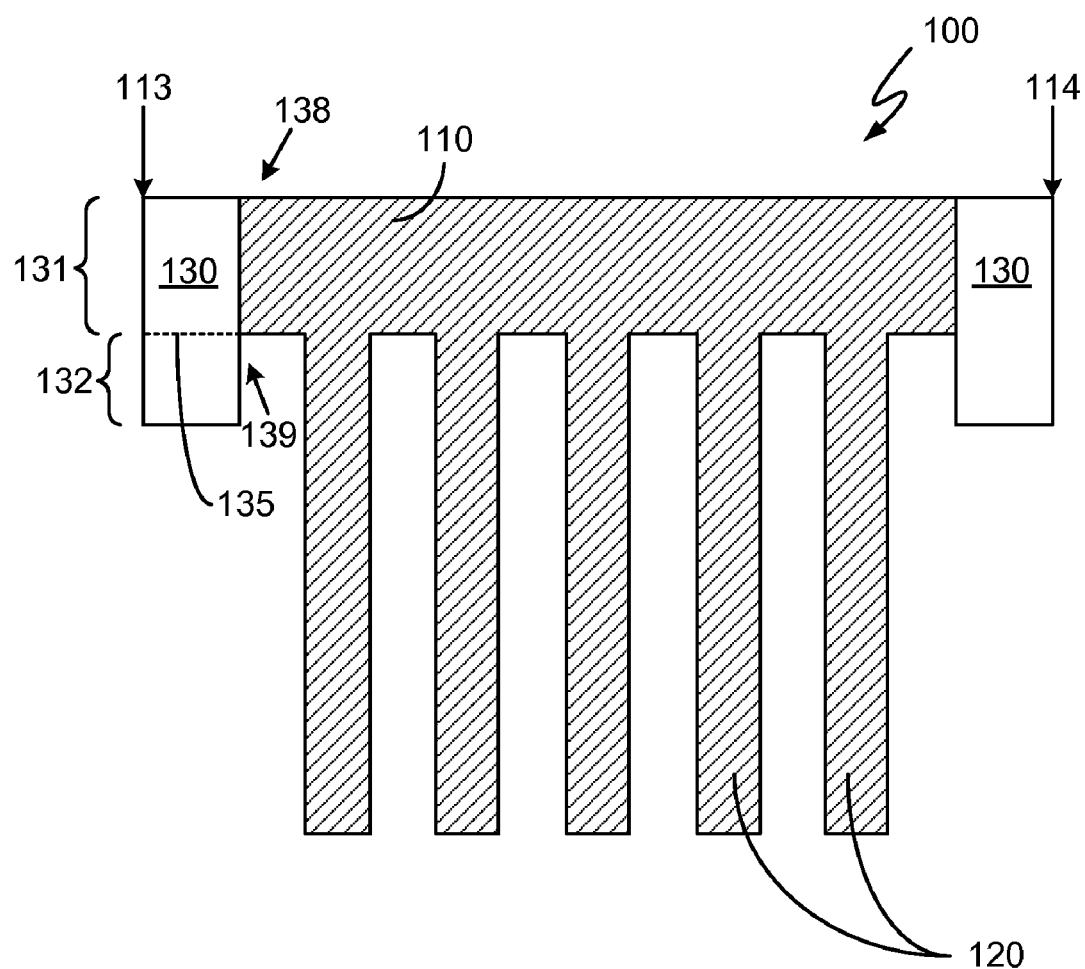
FIG. 1 is a top view of a compact rake piezoelectric assembly according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a compact piezoelectric assembly comprises a body, a plurality of blades extending away from the body, and a piezoelectric patch attached to the body. The piezoelectric patch has a fixed portion and a free portion, with the fixed portion being constrained to be in physical contact with the body.

Because the arrangement of the blades causes them to resemble the prongs of a rake, the piezoelectric assembly may be referred to as a "rake piezoelectric assembly," which in turn may be abbreviated to "rake piezo." Some existing rake piezos are relatively small and compact, with blades shorter than 20 millimeters (mm), for example, but these tend to have large resonance frequency (high noise) and low amplitude (low performance). More typical for existing rake piezos is a blade length exceeding 50 mm, which for small form factor devices can be problematic. Whatever the size, existing rake piezo blades suffer from stiffness and other performance-affecting issues that arise from the way the piezo layers are attached to the blade.

More specifically, it is desirable to operate the blades of the piezoelectric device at resonance because that condition leads to larger amplitude and, thus, better cooling. Attaching a piezoelectric patch along all or part of the length of the blade stiffens the blade and increases the voltage requirement for equivalent amplitude. Also, the resonance frequency for the blade is increased, which leads to increased noise. This manner of attaching the piezoelectric patch also affects the effective length of the blade.

Embodiments of the invention enable compact rake piezos (e.g., with total lengths of 20 mm or less) but with much lower frequency, lower noise, and larger amplitudes than are possible with existing low-form-factor rake piezos. Such advantages are made possible at least in part by the manner in which the piezoelectric material is attached to the piezoelectric assembly, as briefly alluded to above and as will be discussed in greater detail below.

Referring now to the drawings, FIG. 1 is a top view of a compact rake piezoelectric assembly 100 according to an embodiment of the invention. As illustrated in FIG. 1, compact rake piezoelectric assembly 100 comprises a body 110, a plurality of blades 120 extending away from body 110, and a piezoelectric patch 130 attached to an end of body 110. The illustrated embodiment depicts one piezoelectric patch 130 at an end 113 of body 110 and another piezoelectric patch 130 at an end 114 of body 110. In other, non-illustrated, embodiments piezoelectric patch (or patches) 130 can be placed at other positions along body 110. In at least some of those other embodiments, part of body 110 would extend out laterally beyond piezoelectric patch (or patches) 130.

In one embodiment, piezoelectric patch 130 comprises a section 131 that rests on body 110 and a section 132 that extends out beyond body 110. Although it is not readily apparent in FIG. 1, in at least one embodiment section 132 is suspended over an air gap or other empty space. A dashed line 135 in FIG. 1 indicates a boundary separating sections 131 and 132 from each other but this is for purposes of clarity and does not necessarily represent a real feature of piezoelectric patch 130.

Figure 2:
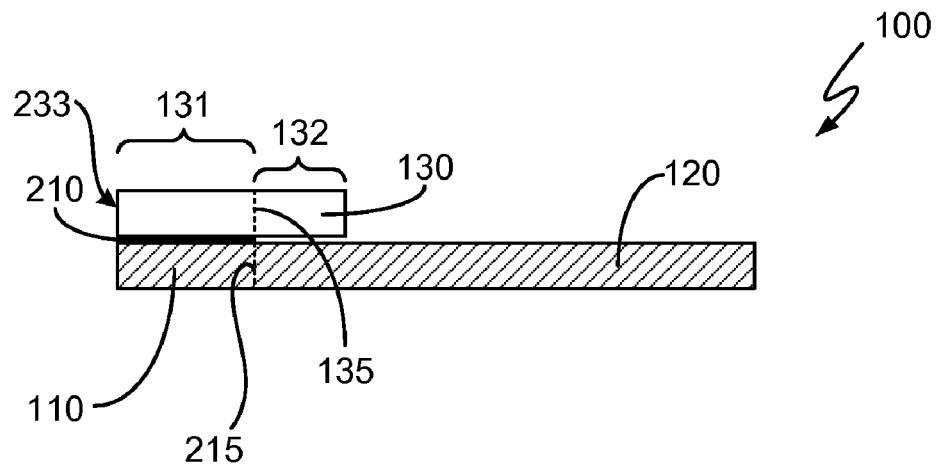
FIG. 2 is a side view of the compact rake piezoelectric assembly of FIG. 1 according to an embodiment of the invention.

As mentioned above, the performance of compact rake piezoelectric assembly 100 can be strongly affected by the manner in which piezoelectric patch 130 is attached to it. In that regard, piezoelectric patch 130 has a fixed portion 138 and a free portion 139, where fixed portion 138 is constrained to be in physical contact with body 110. Fixed portion 138 occupies a lesser or greater amount of section 131, depending on the embodiment. In one embodiment, for example, fixed portion 138 comprises at least substantially all of section 131. A side view of this embodiment is shown in FIG. 2. In other embodiments fixed portion 138 comprises a part of but less than all of section 131, such as an embodiment where fixed portion 138 comprises no more than a line along an edge of section 131. In general, the smaller fixed portion 138 is in relation to the total size of piezoelectric patch 130, the smaller the stiffness of compact rake piezoelectric assembly 100 will be, and consequently the lower the resonant frequency and the lower the noise.

In FIG. 2 a line 215 represents the right-most extent of body 110 and the point at which blade 120 becomes visible (in the side view depicted). An epoxy, solder, or other adhesive 210 is shown in various configurations underneath piezoelectric patch 130, with fixed portion 138 at least roughly corresponding to that portion of piezoelectric patch 130 under which adhesive 210 is found. It may also be helpful to re-state here that, although it is not readily apparent from this side view, in at least one embodiment section 132 of piezoelectric patch 130 is suspended over an empty space.

Referring to FIG. 2, it may be seen that adhesive 210 extends all the way from an edge 233 of piezoelectric patch 130 to line 135, i.e., across all of section 131. Thus, in this embodiment, fixed portion 138 corresponds to section 131. It should be noted that, although not depicted in the drawing, the embodiment of FIG. 2 may be capable of a sort of swinging motion, with line 215 acting like a hinge. As an example, this swinging motion may occur as a result of the oscillation of blades 120.

As known in the art, a piezoelectric patch (sometimes also referred to as a piezoelectric actuator) comprises at least one layer of piezoelectric material sandwiched between a pair of electrodes. Some piezoelectric patches have additional layers of piezoelectric material, each of which, like the first piezoelectric layer, are sandwiched between two electrodes, and are called multi-layer piezoelectric patches (or something similar). In one embodiment, piezoelectric patch 130 is a multi-layer piezoelectric patch while in another embodiment it contains just a single piezoelectric layer. Multi-layer piezoelectric patches may allow better oscillation amplitude at lower frequency and so further reduce noise.

Figure 3:
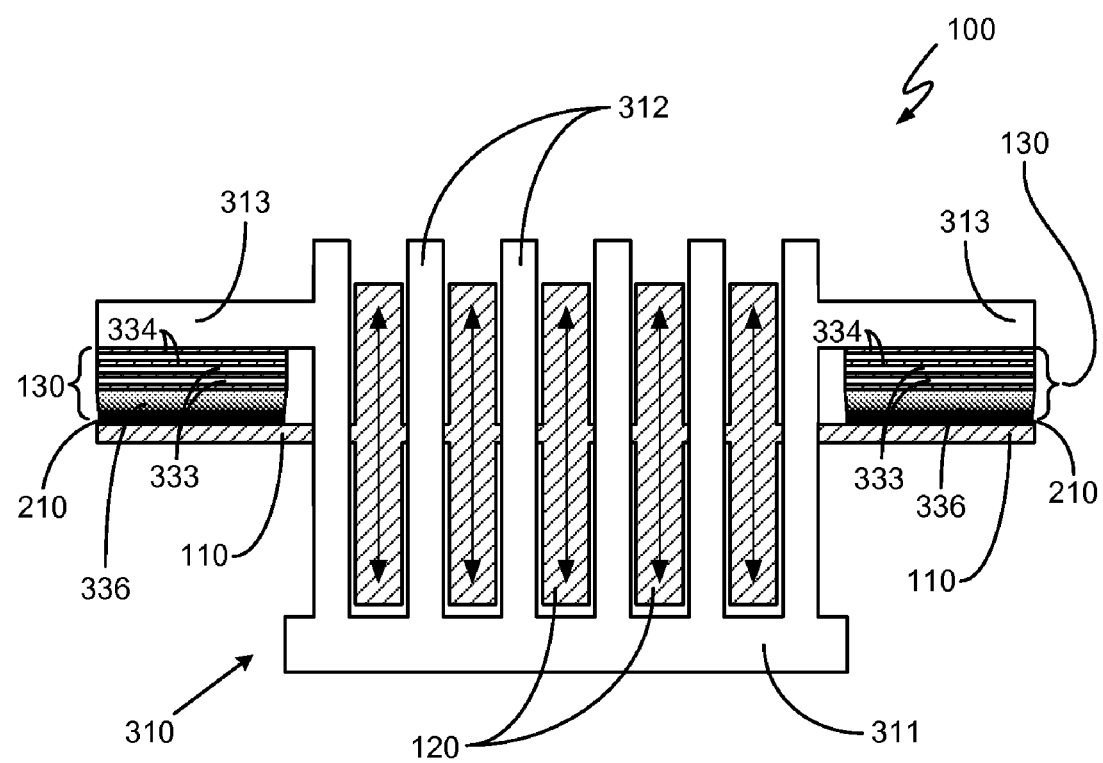
FIG. 3 is a front elevational view of a compact rake piezoelectric assembly according to an embodiment of the invention.

FIG. 3 is a front elevational view of compact rake piezoelectric assembly 100 according to an embodiment of the invention. As illustrated in FIG. 3, compact rake piezoelectric assembly 100 further comprises a heat sink 310 comprising a base 311 and a plurality of fins 312 extending away from base 311. Also visible in FIG. 3 are body 110, blades 120, and piezoelectric patch 130, each of which were first shown in FIG. 1, and adhesive 210, first shown in FIG. 2. It should be noted that FIG. 3 depicts blades 120 during active oscillation which, in this front elevational view, makes blades 120 appear as extended bodies that occupy the whole of their oscillation path. The double-headed arrows that appear in the center of each of blades 120 are intended to highlight this oscillatory motion.

In the illustrated embodiment, piezoelectric patch 130 is a multi-layer piezoelectric patch comprising layers 333 of piezoelectric material sandwiched between electrodes 334, all of which are electrically connected to each other in parallel. As described above, piezoelectric patch 130 has a fixed portion and a free portion, a fact that allows piezoelectric patch 130 a range of motion with respect to body 110, shown in FIG. 3 by the shading and the tapered sides of a region 336, which represents the slanted underside of the bottom one of electrodes 334.

In one embodiment, heat sink 310 further comprises a platform 313 extending from one of fins 312. In the illustrated embodiment, each of the outside fins 312 have such a platform 313 extending therefrom at a point close to the top of those outside fins. In other embodiments some other number of fins, attached at some other location, may be used.

As may be seen in the figure, piezoelectric patch 130 may be attached to platform 313 and also attached to body 110 using adhesive 210 as has been described previously. As an example, heat sink 310 may be formed in an extrusion process and that process may include the extrusion of platform 313. In another embodiment, heat sink 310 may be formed first and platform 313 attached later in a separate step.

Referring still to FIG. 3, each one of blades 120 lies between two of fins 312 of heat sink 310. This arrangement provides compact rake piezoelectric assembly 100 with enhanced cooling capacity over what is possible with heat sink 310 alone. As this is a primary motivation for the development of compact rake piezoelectric assembly 100, the reason for this enhanced cooling capacity will now be explained in greater detail.

As a consequence of air flowing through and around heat sink 310, a boundary layer of air is created around each fin 312. The boundary layer, which is due to friction between surfaces of the fins and the air at those surfaces, reduces the ability of the fins to transfer heat to the surrounding air beyond the boundary layer. This reduction in heat transfer capability may be overcome if the boundary layer is disturbed such that air is not allowed to stop on the fins, and this is accomplished via the oscillation of blades 120. The oscillation causes air to circulate near the fin surface and this results in a significant improvement of the convective heat transfer, i.e., the heat transfer coefficient will be improved significantly. It should be noted that the blades only need to oscillate a small amount, such as, for example, approximately 10 micrometers or so, in order to disturb the boundary layer to the point where these heat transfer advantages are realized.

Figure 4:
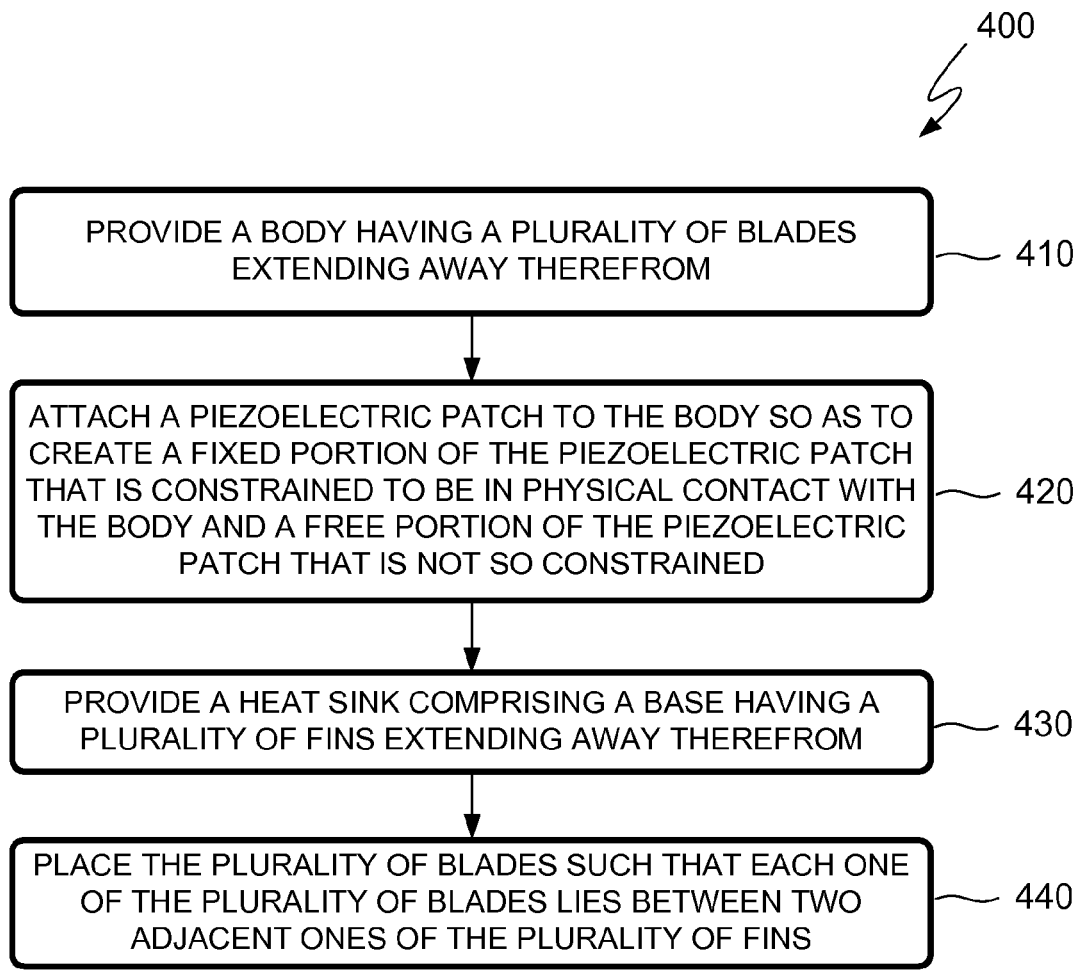
FIG. 4 is a flowchart illustrating a method of manufacturing a compact rake piezoelectric assembly according to an embodiment of the invention.

FIG. 4 is a flowchart illustrating a method 400 of manufacturing a compact rake piezoelectric assembly according to an embodiment of the invention. A step 410 of method 400 is to provide a body having a plurality of blades extending away therefrom. As an example, the body and the plurality of blades can be similar to, respectively, body 110 and blades 120 that are first shown in FIG. 1. In one embodiment, step 410 comprises extruding the body such that the body includes a platform, or otherwise providing a platform attached to the body. As an example, the platform can be similar to platform 313 that is first shown in FIG. 3.

A step 420 of method 400 is to attach a piezoelectric patch to the body so as to create a fixed portion of the piezoelectric patch that is constrained to be in physical contact with the body and a free portion of the piezoelectric patch that is not so constrained. As an example, the piezoelectric patch can be similar to piezoelectric patch 130 that is first shown in FIG. 1. As another example, the fixed portion and the free portion can be similar to, respectively, fixed portion 138 and free portion 139, both of which are also first shown in FIG. 1.

As described above, the piezoelectric patch can comprise a first section that rests on the body and a second section that extends out beyond the body. As an example, the first section can be similar to section 131 and the second section can be similar to section 132, both of which are first shown in FIG. 1. In one embodiment, step 420 or another step can comprise creating the fixed portion of the piezoelectric patch such that it comprises at least substantially all of the first section. In another embodiment, step 420 or another step can comprise creating the fixed portion such that it comprises a part of but less than all of the first section, as described above.

In connection with an embodiment where step 410 comprises providing a body having a platform, step 420 can comprise attaching the piezoelectric patch to the platform. Such attachment can be to the underside of the platform, as in FIG. 3, to the top of the platform, or to some other platform location.

A step 430 of method 400 is to provide a heat sink comprising a base having a plurality of fins extending away therefrom. As an example, the heat sink, the base, and the plurality of fins can be similar to, respectively, heat sink 310, base 311, and fins 312, all of which are shown in FIG. 3.

A step 440 of method 400 is to place the plurality of blades such that each one of the plurality of blades lies between two adjacent ones of the plurality of fins. As an example, the result of step 440 may be a configuration such as that shown in FIG. 3, where each one of blades 120 lies between or extends between two of fins 312 that are adjacent to each other. In a non-illustrated embodiment, blades 120 may also lie between two of fins 312 but those two fins, while being adjacent to the blade 120, need not necessarily be adjacent to each other, leaving open the possibility that certain fins do not have a blade next to them.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the compact rake piezoelectric assemblies and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are equivalents or are potentially equivalents of express elements and/or limitations in the claims under the doctrine of equivalents.

What is claimed is:

1. A compact rake piezoelectric assembly comprising:
   a body;
   a plurality of blades extending away from the body; and
   a piezoelectric patch attached at an end of the body,
   wherein:
   the piezoelectric patch has a fixed portion and a free portion;
   the free portion is not constrained to be in physical contact with any portion of the compact rake piezoelectric assembly, thus enabling the free portion to move through a range of motion with respect to the body and the plurality of blades; and
   the fixed portion is constrained to be in physical contact with the body.

2. The compact rake piezoelectric assembly of claim 1 wherein:
   the piezoelectric patch comprises a first section that rests on the body and a second section that extends out beyond the body.

3. The compact rake piezoelectric assembly of claim 2 wherein:
   the second section is suspended over an empty space.

4. The compact rake piezoelectric assembly of claim 2 wherein:
   the fixed portion of the piezoelectric patch comprises at least substantially all of the first section.

5. The compact rake piezoelectric assembly of claim 1 wherein:
   the piezoelectric patch is a multi-layer piezoelectric patch.

6. The compact rake piezoelectric assembly of claim 1 further comprising:
   a heat sink comprising:
   a base; and
   a plurality of fins extending away from the base,
   wherein:
   each one of the plurality of blades lies between two of the plurality of fins of the heat sink.

7. A compact rake piezoelectric assembly comprising:
   a body having a first end, a second end opposite the first end, and a center portion between the first end and the second end;
   a plurality of blades extending away from the center portion of the body;
   a first piezoelectric patch attached to the first end of the body; and
   a second piezoelectric patch attached to the second end of the body,
   wherein:
   the first piezoelectric patch has a first fixed portion and a first free portion, the first fixed portion constrained to be in physical contact with the body;
   the second piezoelectric patch has a second fixed portion and a second free portion, the second fixed portion constrained to be in physical contact with the body;
   the first free portion is not constrained to be in physical contact with any portion of the compact rake piezoelectric assembly, thus enabling the first free portion to move through a range of motion with respect to the body and the plurality of blades; and the second free portion is likewise not constrained to be in physical contact with any portion of the compact rake piezoelectric assembly, thus enabling the second free portion to move through a range of motion with respect to the body and the plurality of blades.

8. The compact rake piezoelectric assembly of claim 7 wherein:

the first piezoelectric patch comprises a first section that rests on the body and a second section that extends out beyond the body; and the second piezoelectric patch comprises a third section that rests on the body and a fourth section that extends out beyond the body.

9. The compact rake piezoelectric assembly of claim 8 wherein:

the second section and the fourth section are suspended over an empty space.

10. The compact rake piezoelectric assembly of claim 9 wherein:

the first fixed portion comprises at least substantially all of the first section; and the second fixed portion comprises at least substantially all of the third section.

11. The compact rake piezoelectric assembly of claim 9 wherein:

the first piezoelectric patch and the second piezoelectric patch each are multi-layer piezoelectric patches.

12. The compact rake piezoelectric assembly of claim 9 further comprising:

a heat sink comprising:

a base; and a plurality of fins extending away from the base, wherein:

each one of the plurality of blades lies between two of the plurality of fins of the heat sink.

* * * * *